United States Patent
Nakano et al.

(10) Patent No.: US 9,504,155 B2
(45) Date of Patent: *Nov. 22, 2016

(54) TOUCH SENSOR BUILT-IN DISPLAY DEVICE STRUCTURE

(71) Applicant: Japan Display Inc., Tokyo (JP)

(72) Inventors: Yasushi Nakano, Tokyo (JP); Hitoshi Kawaguchi, Tokyo (JP); Hideaki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,454

(22) Filed: Dec. 7, 2015

(65) Prior Publication Data

US 2016/0088732 A1    Mar. 24, 2016

Related U.S. Application Data

(63) Continuation of application No. 14/314,362, filed on Jun. 25, 2014, now Pat. No. 9,235,286.

(30) Foreign Application Priority Data

Jun. 26, 2013    (JP) ................. 2013-133488

(51) Int. Cl.
*H05K 1/11*    (2006.01)
*G06F 3/041*   (2006.01)
*H05K 1/18*    (2006.01)

(52) U.S. Cl.
CPC ............. *H05K 1/117* (2013.01); *G06F 3/0412* (2013.01); *H05K 1/189* (2013.01); *G06F 2203/04103* (2013.01)

(58) Field of Classification Search
CPC ...... H05K 7/026; H05K 1/189; H05K 3/361; H05K 2201/10128; H05K 3/323; G02F 1/13452; Y10T 29/49117; G06F 2203/04103
USPC ....................................... 257/70, 72
See application file for complete search history.

(56) References Cited

U.S. PATENT DOCUMENTS

| | | | |
|---|---|---|---|
| 9,235,362 B2 * | 1/2016 | Terakado ............... | G06F 3/122 |
| 2010/0182273 A1 | 7/2010 | Noguchi et al. | |
| 2011/0090170 A1 | 4/2011 | Lin et al. | |
| 2012/0146919 A1 | 6/2012 | Kim et al. | |
| 2013/0258614 A1 | 10/2013 | Misaki | |

FOREIGN PATENT DOCUMENTS

| | | |
|---|---|---|
| JP | 2009-244958 A | 10/2009 |
| TW | M460332 U | 8/2013 |

OTHER PUBLICATIONS

Office Action issued by Taiwanese Patent Office on Oct. 15, 2015 regarding a counterpart Taiwanese patent application No. 103120751.

* cited by examiner

*Primary Examiner* — Dung Le
(74) *Attorney, Agent, or Firm* — Typha IP LLC

(57) ABSTRACT

Touch sensor includes plural first connection terminals which are arranged side by side in one direction on a first circuit substrate, and plural second connection terminals which are arranged side by side in the one direction on a second substrate connected to the plural first connection terminals. Each of the plural second connection terminals includes plural first wirings extending in a direction crossing the one direction, and a second wiring connected to the plural first wirings and extending in the one direction. The second wiring is provided in a region where the second circuit substrate is overlapped with the first circuit substrate.

8 Claims, 11 Drawing Sheets

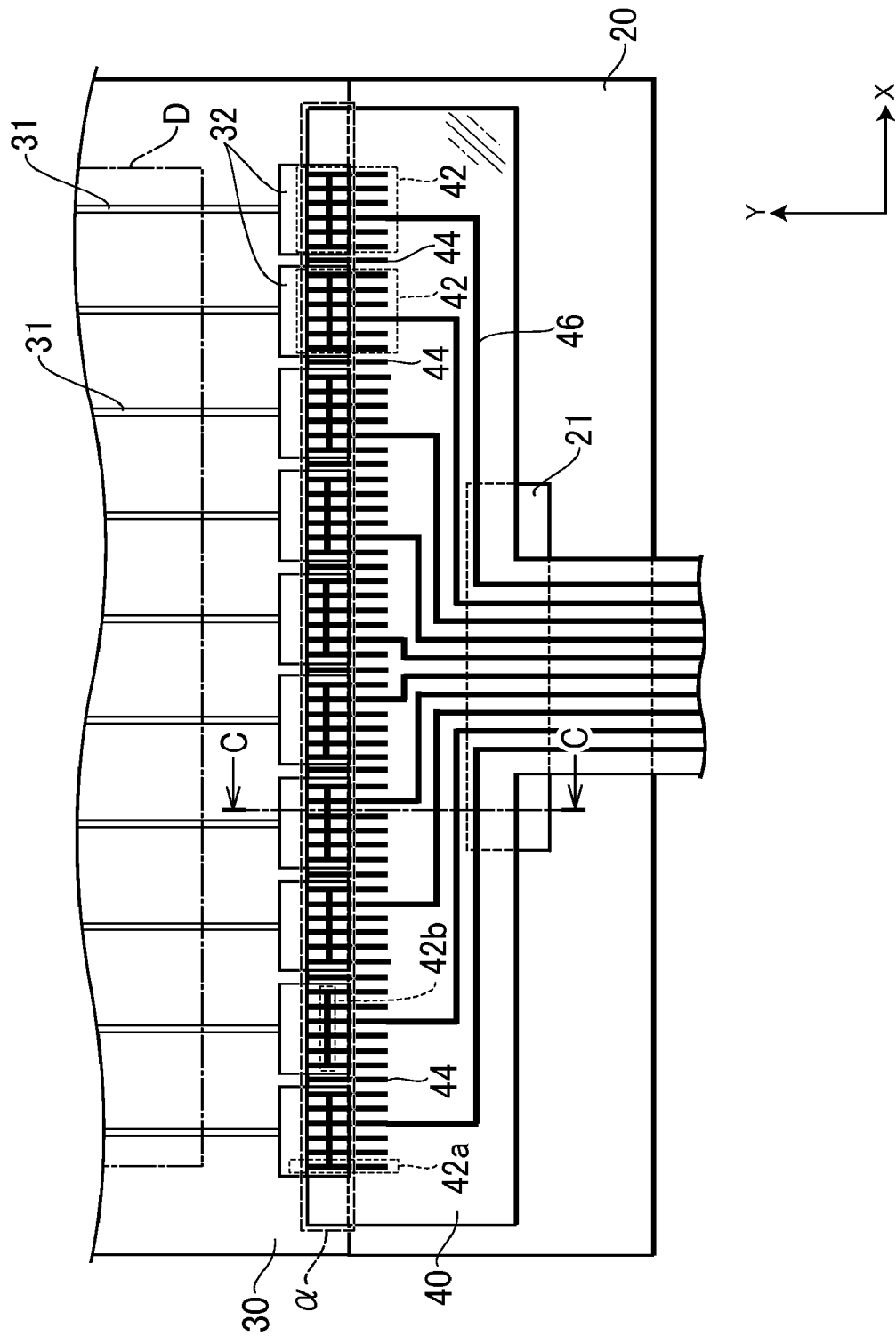

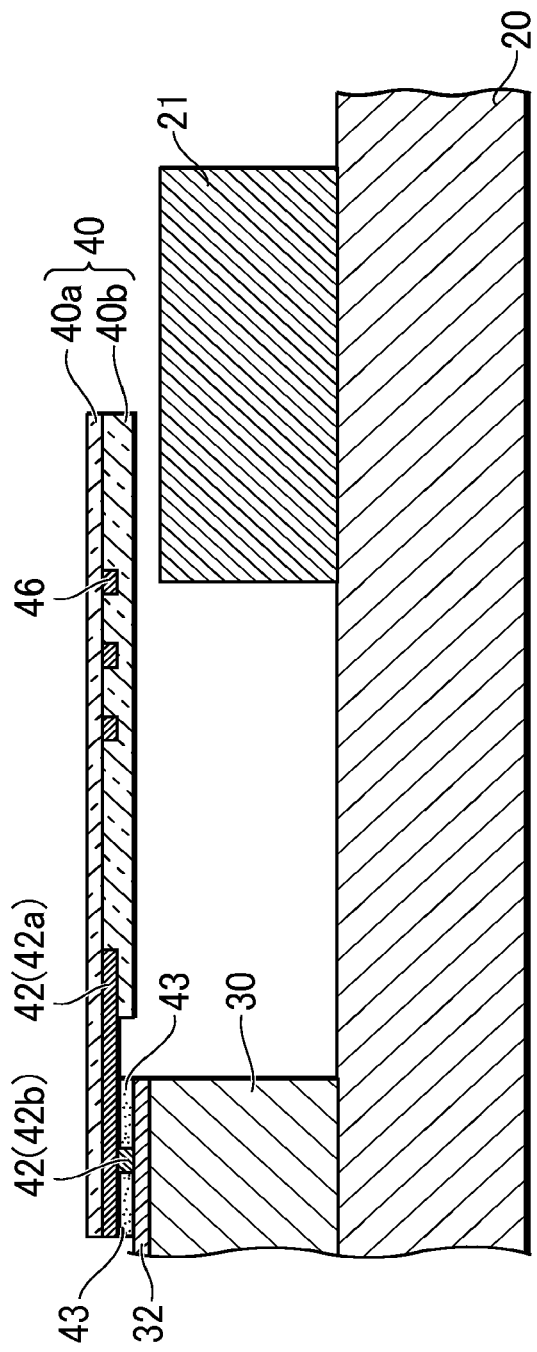

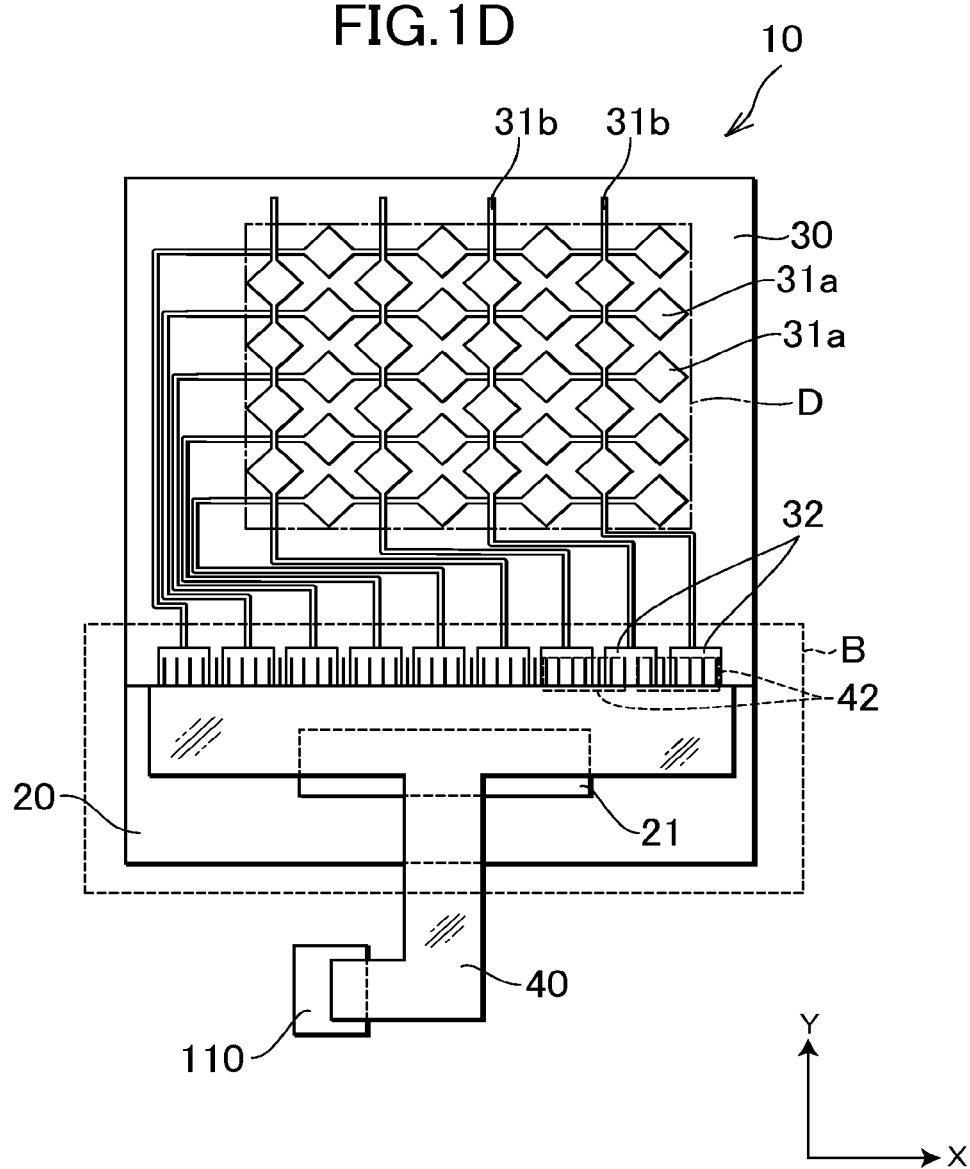

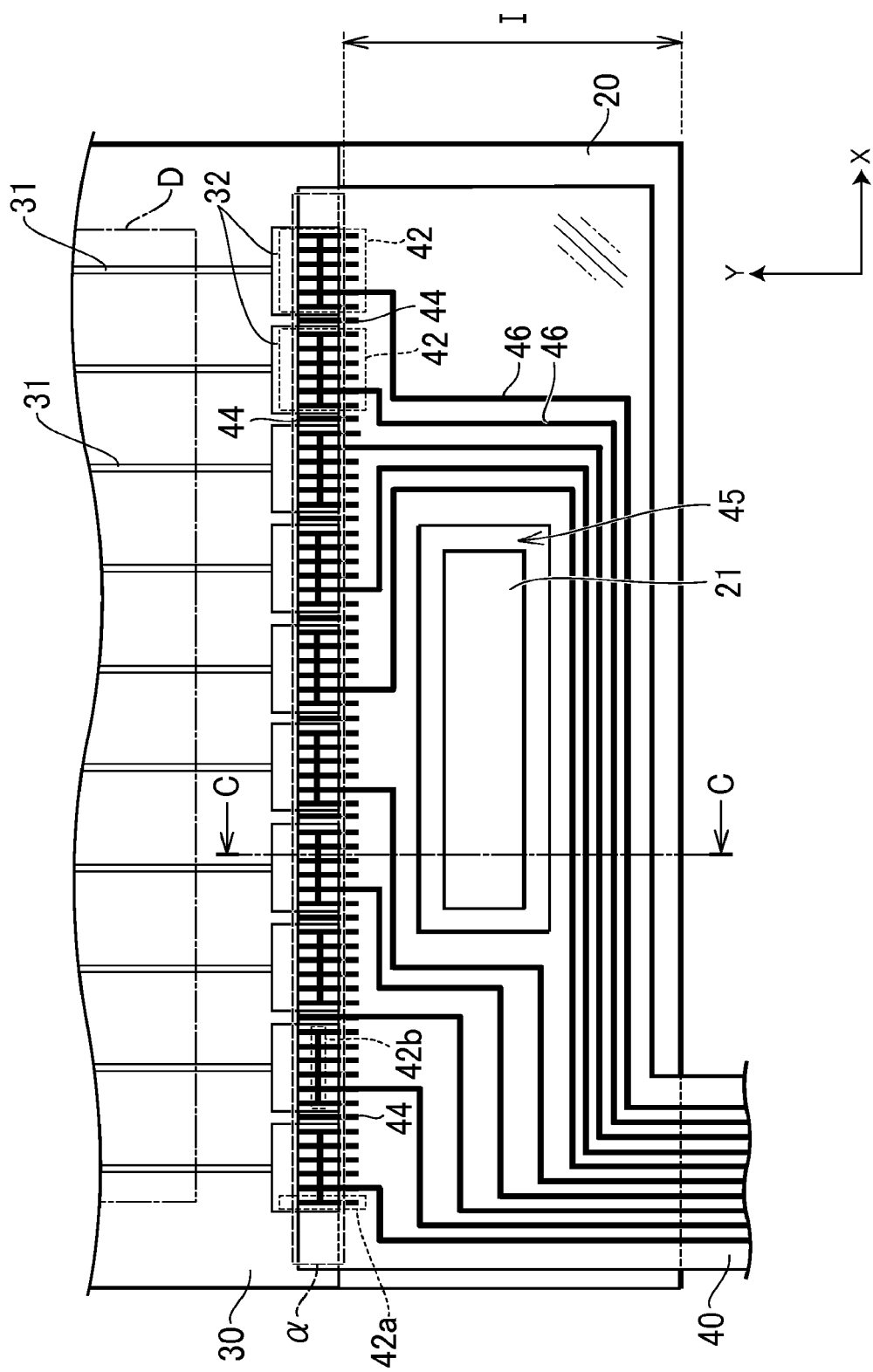

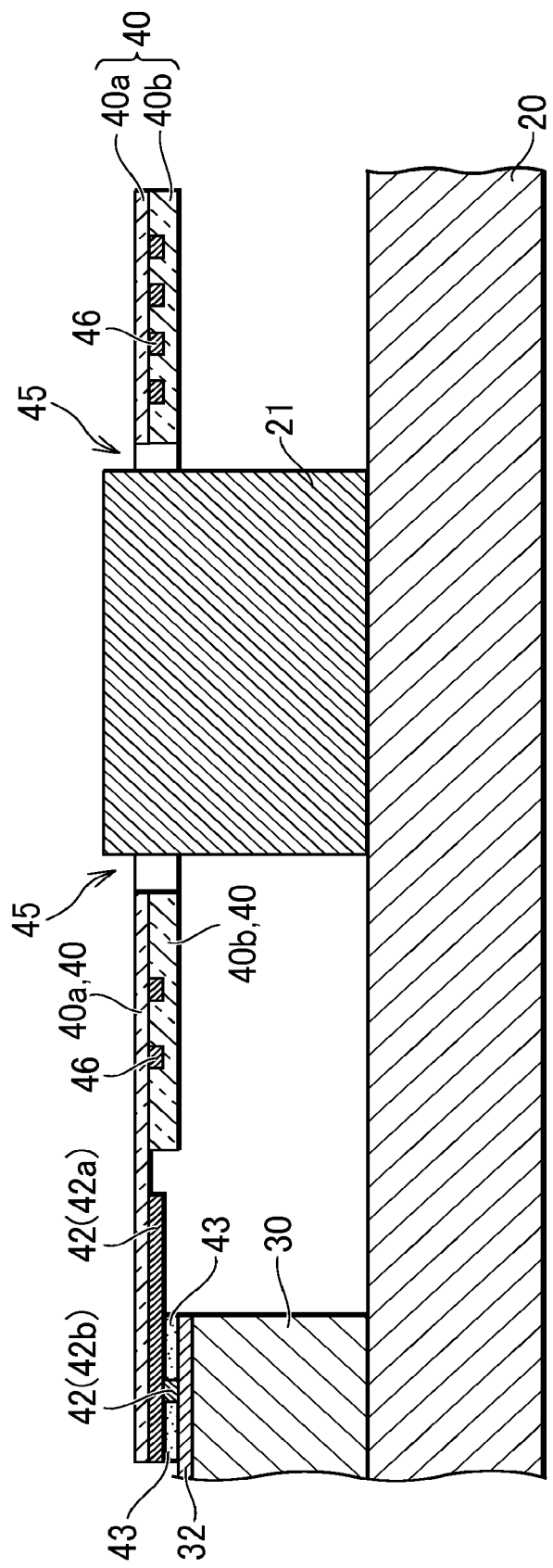

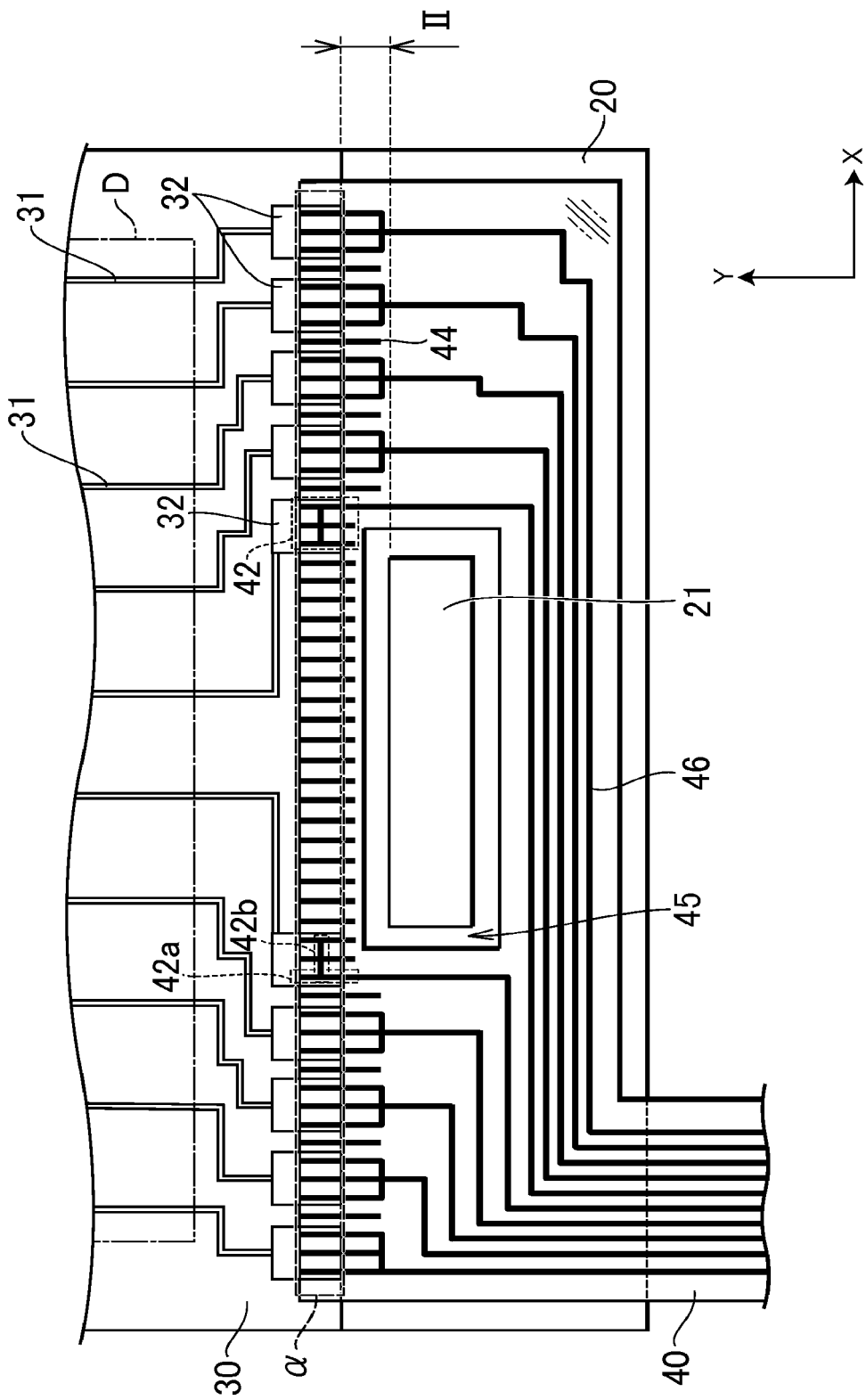

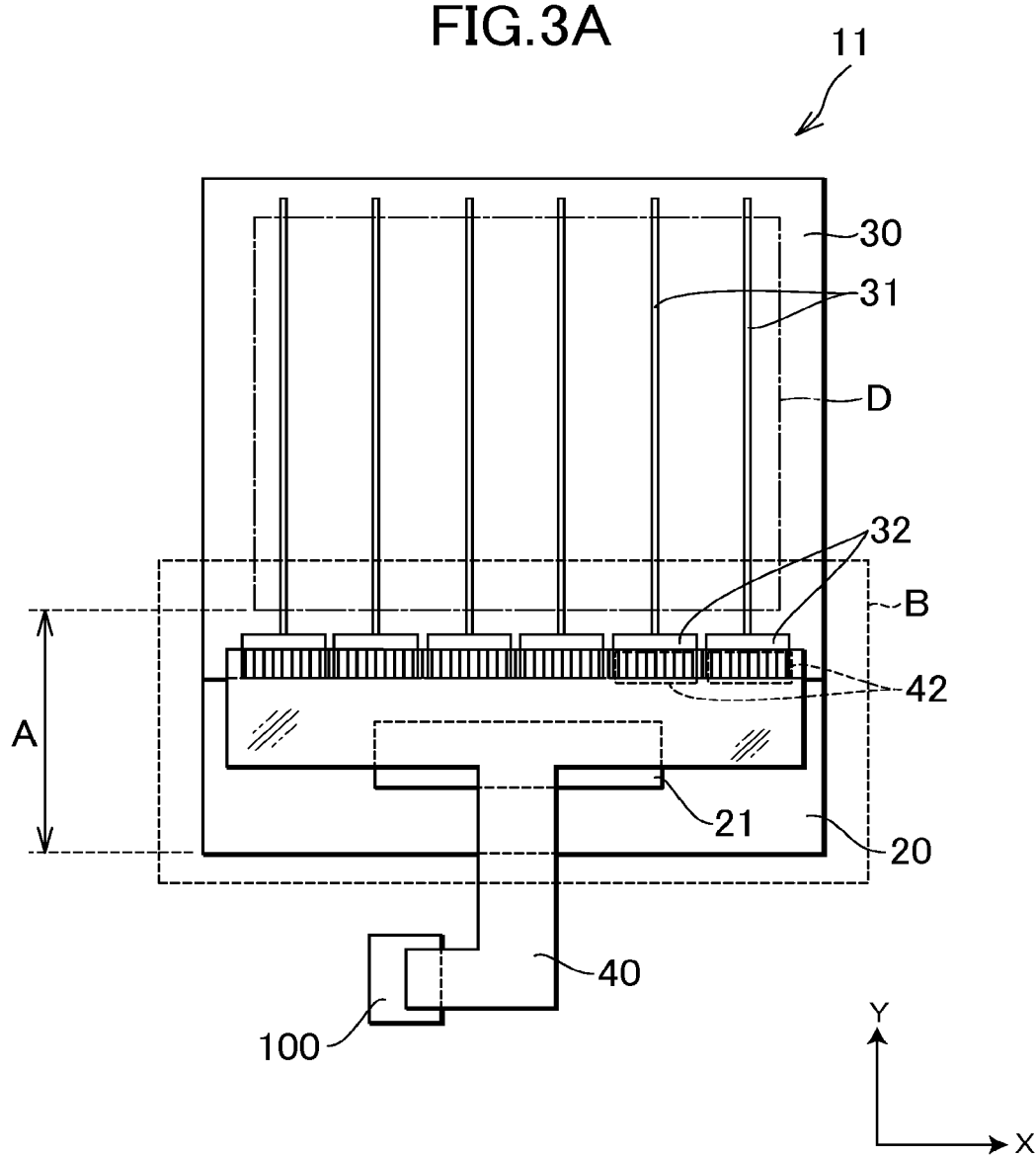

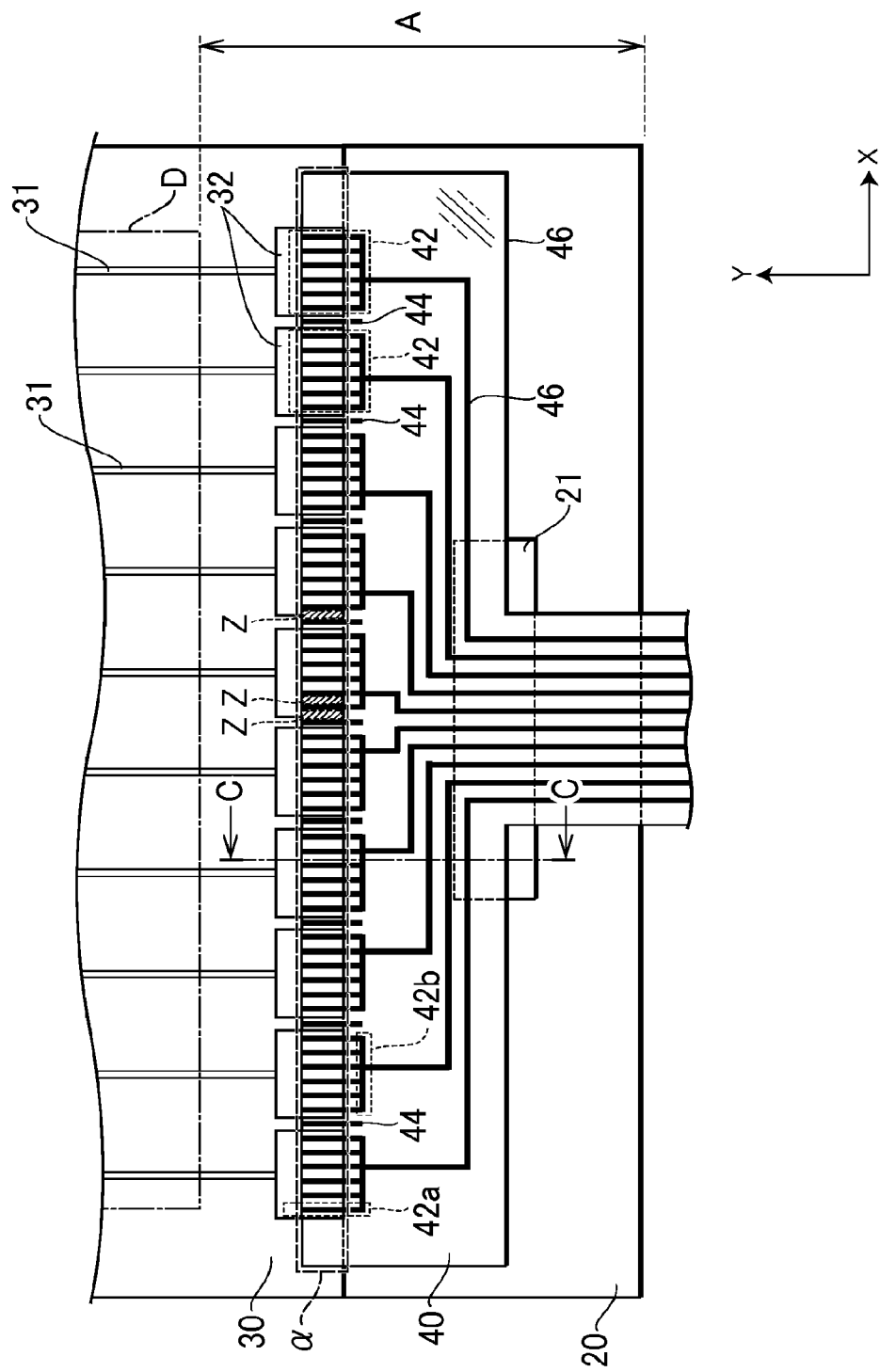

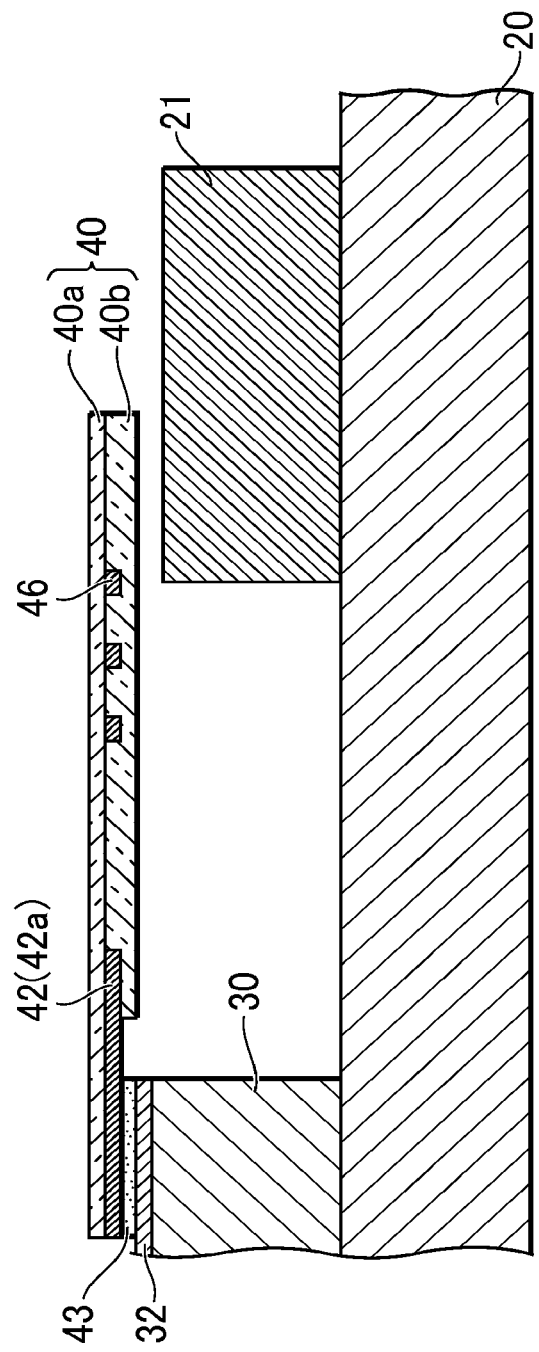

TOUCH SENSOR BUILT-IN DISPLAY DEVICE STRUCTURE

CROSS-REFERENCE TO RELATED APPLICATIONS

This application is a Continuation of U.S. patent application Ser. No. 14/314,362, now U.S. Pat. No. 9,235,286, filed on Jun. 25, 2014, which claims the priority from Japanese Patent Application No. JP 2013-133488A filed on Jun. 26, 2013 in the Japanese Patent Office, the entire contents of which are incorporated herein by reference.

BACKGROUND OF THE INVENTION

1. Field of the Invention

The present invention relates to a terminal connection structure and a touch sensor built-in display device, and particularly to the touch sensor built-in display device including the terminal connection structure.

2. Description of the Related Art

In recent years, attention is paid to a so-called touch sensor built-in display device in which a touch detection device (touch sensor) called a so-called touch panel is arranged on a display device, and instead of normal buttons, various buttons are displayed on the display device so that information can be inputted.

In the tendency increase in size of a screen of a mobile since this technique enables the display and the buttons to be arranged to a common region, great merits such as space saving and reduction in the number of parts are obtained.

JP 2009-244958A discloses a display device with a touch sensor in which an electrode for a touch sensor is formed on an upper surface of a color filter substrate.

SUMMARY OF THE INVENTION

FIG. 3A is a plan view showing an example of a prior art touch sensor built-in display device in which a touch detection device (touch sensor) is arranged on a display device. FIG. 3B is an enlarged view showing a region B indicated by a broken line in FIG. 3A and showing a connection structure between a connection terminal provided on the display device and a flexible printed circuit substrate (FPC). FIG. 3C is a view showing a section taken along line C-C in FIG. 3B.

Here, with an increase in size of a display screen in a recent electric equipment or a decrease in size of an electric equipment, reduction of, for example, frame size (size between the outer shape of a display screen region and the outer shape of a TFT substrate, for example, size A shown in FIGS. 3A and 3B) not contributing to the display screen is required. The inventor earnestly studied to satisfy the request by devising a terminal connection structure between first connection terminal 32 provided on a CF substrate 30 and a second connection terminal 42 provided on a flexible printed circuit substrate (FPC) 40.

An object of the invention is to realize space saving of an electric equipment and to provide a terminal connection structure including plural first connection terminals which are arranged side by side in one direction on a first circuit substrate, and plural second connection terminals which are arranged side by side in the one direction on a second resin circuit substrate overlappingly connected to the first circuit substrate and are respectively connected to the plural first connection terminals.

Incidentally, the space saving of the electric equipment may specifically mean the miniaturization of the electric equipment or the reduction of the frame size not contributing to the display screen in the electric equipment including the display screen.

The above and other objects and the novel features of the invention will be clarified by the description of the specification and the attached drawings.

According to a first aspect or the invention, a terminal connection structure includes plural first connection terminals which are arranged side by side in one direction on a first circuit substrate, and plural second connection terminals which are arranged side by side in the one direction on a second resin circuit substrate overlappingly connected to the first circuit substrate and are respectively connected to the plural first connection terminals, each of the plural second connection terminals includes plural first wirings extending in a direction crossing the one direction, and a second wiring connected to the plural first wirings and extending in the one direction, and the second wiring is provided in a region where the second circuit substrate is overlapped and connected to the first circuit substrate.

Besides, the second wiring may be positioned in a center portion of three portions obtained by dividing the region where the second circuit substrate is overlapped and connected to the first circuit substrate into three equal parts in a direction perpendicular to the one direction.

According to second aspect of the invention, a touch sensor built-in display device includes a TFT substrate in which pixels including thin film transistors are arranged in a matrix form on an insulation substrate, plural first connection terminals which are arranged side by side in one direction on a first circuit substrate arranged to face the TFT substrate and including touch sensor detection electrodes, and plural second connection terminals which are arranged side by side in the one direction on a second resin circuit substrate overlappingly connected to the first circuit substrate and are respectively connected to the plural first connection terminals, each of the plural second connection terminals includes plural first wirings extending in a direction crossing the one direction, and a second wiring connected to the plural first wirings and extending in the one direction, and the second wiring is provided in a region where the second circuit substrate is overlapped and connected to the first circuit substrate.

Besides, the second wiring may be positioned in a center portion of three portions obtained by dividing the region where the second circuit substrate is overlapped and connected to the first circuit substrate into three equal parts in a direction perpendicular to the one direction. Besides, an electric component for controlling driving of the thin film transistors may be further provided on the TFT substrate, the electric component may be positioned in a region overlapping an inside of an outer edge of the second circuit substrate in plan view, and the second circuit substrate may include an opening part opening in the region to avoid overlapping with the electric component in plan view. Besides, the first connection terminal may be arranged in a region other than a region provided with the opening part in the direction perpendicular to the one direction in the region where the first circuit substrate is overlapped and connected to the second circuit substrate in plan view.

According to the invention, there is provided the terminal connection structure which realizes the space saving of an electric equipment and includes the plural first connection terminals arranged side by side in one direction on the first circuit substrate, and the plural second connection terminals which are arranged side by side in the one direction on the second resin circuit substrate overlapping connected to the first circuit substrate and are respectively connected to the plural first connection terminals.

BRIEF DESCRIPTION OF THE DRAWINGS

FIG. 1B is an enlarged view showing a region B indicated by a broken line in FIG. 1A and showing a connection structure between a connection terminal provided on a display device and a flexible printed circuit substrate (FPC).

FIG. 1C is a view showing a section taken along line C-C in FIG. 1B.

FIG. 1D is a plan view showing another touch sensor built-in display device including the terminal connection structure of the first embodiment of the invention.

FIG. 2B is an enlarged view showing a region B indicated by a broken line in FIG. 2A and showing a connection structure between a connection terminal provided on a display device and a flexible printed circuit substrate (FPC).

FIG. 2C is a view showing a section taken along line C-C in FIG. 2B.

FIG. 2D is an enlarged view showing the region B indicated by the broken line in FIG. 2A and showing another example of the connection structure between the connection terminal provided on the display device and the flexible printed circuit substrate (FPC).

FIG. 3A is a plan view showing an example of a prior art touch sensor built-in display device in which a touch detection device (touch sensor) is arranged on a display device.

FIG. 3B is an enlarged view showing a region B indicated by a broken line in FIG. 3A and showing a connection structure between a connection terminal provided on the display device and a flexible printed circuit substrate (FPC).

FIG. 3C is a view showing a section take along line C-C in FIG. 3B.

DETAILED DESCRIPTION OF THE INVENTION

Figure 1A:
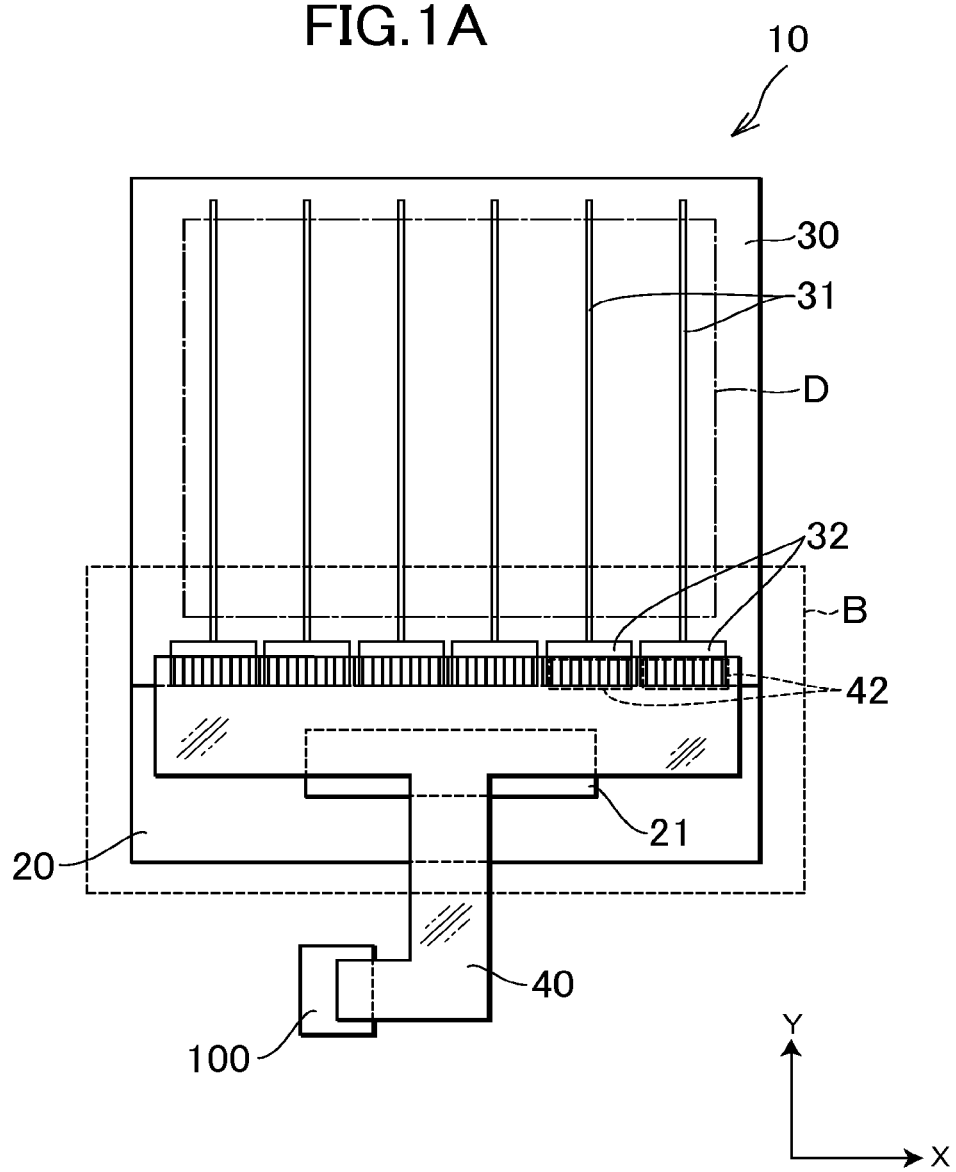
FIG. 1A is a plan view showing a touch sensor built-in display device including a terminal connection structure of a first embodiment of the invention.

A terminal connection structure of the invention includes plural first connection terminals which are arranged side by side in one direction on a first circuit substrate, and plural second connection terminals which are arranged side by side in the one direction on a second resin circuit substrate overlappingly connected to the first circuit substrate and are respectively connected to the plural first connection terminals. Each of the plural second connection terminals includes plural first wirings extending in a direction crossing the one direction, and a second wiring connected to the plural first wirings and extending in the one direction. The second wiring provided in a region where the second circuit substrate is overlapped and connected to the first circuit substrate.

The terminal connection structure of the invention described below includes the plural first connection terminals which are arranged side by side in the one direction on the first circuit substrate, and the plural second connection terminals which are arranged side by side in the one direction on the second resin circuit substrate overlappingly connected to the first circuit substrate and are respectively connected to the plural first connection terminals. The terminal connection structure can be applied to various electric equipments. Besides, the terminal connection structure of the invention may be applied to a touch sensor built-in display device.

First, with respect to a prior at terminal connection structure including plural first connection terminals which are arranged side by side in one direction on a first circuit substrate, and plural second connection terminals which are arranged side by side in the one direction on a second resin circuit substrate overlappingly connected to the first circuit substrate and are respectively connected to the plural first connection terminals, a description will be made based on an example in which the terminal connection structure is applied to a touch sensor built-in display device.

FIG. 3A is a plan view showing an example of a prior art touch sensor built-in display device in which a touch detection device (touch sensor) is arranged on a display device. FIG. 3B is an enlarged view showing region B indicated by a broken line in FIG. 3A and showing a connection structure between a connection terminal provided on the display device and a flexible printed circuit substrate (FPC). FIG. 3C is a view showing a section taken along line C-C in FIG. 3B.

As shown in FIG. 3A, the prior art touch sensor built-in display device includes, for example, a TFT substrate 20 in which pixels including thin film transistor (TFT) are arranged in a matrix form on an insulation substrate, and a color filter (CF) substrate 30 arranged to face the TFT substrate 20 and including touch sensor detect on electrodes 31. The CF substrate 30 includes plural first connection terminals 32 which are arranged side by one direction (X direction in FIG. 3A) and are connected touch sensor detection electrodes 31.

Besides, a flexible printed circuit substrate (FPC) 40 as a resin circuit substrate overlappingly connected to the CF substrate 30 includes plural second connection terminals 42 which are arranged side by side in the one direction (X direction in FIG. 3A) and are respectively connected to the plural first connection terminals 32.

As shown in FIGS. 3A and 3B, the flexible printed circuit substrate (FTC) 40, which is the resin circuit substrate overlappingly connected to the CF substrate 30, is positioned in a region where an inside of an outer edge of the second circuit substrate 40 overlaps a driver IC 21 for controlling driving of the thin film transistors provided on the TFT substrate 20 in plan view.

Resides, as shown in FIG. 3C, the CF substrate 30 and the flexible printed circuit substrate (FPC) 40 are firmly connected by providing, for example, an anisotropic conductive adhesive (ACF) 43 between plural first wirings 42a constituting the respective plural second connection terminals 42 and extending in a direction (Y direction in FIGS. 3A and 3B) crossing the one direction (X direction in FIGS. 3A and 3B) and by bonding.

Incidentally, as shown in FIG. 3C, the flexible printed circuit substrate (FPC) 40 includes a base film 40a and a cover film 40b, and wirings 46 electrically connected to the second connection terminals 42 are sandwiched and arranged between the base film 40a and the cover film 40b.

The first wirings 42a constituting the plural second connection terminals 42 are bundled and connected (wire-connected) by a second wiring 42b extending in the direction (X direction in FIGS. 3A and 3B) and provided in a region other than a region α were the flexible printed circuit substrate (FPC) 40 is overlapped and connected to the CF substrate 30.

Incidentally, in the region α of the flexible printed circuit substrate (FTC) 40 overlapping connected to the CF substrate 30, it is preferable for keeping uniform connection in the whole connection surface between the substrates that ranges (for example, regions indicated by character Z in FIG. 3B) where the flexible printed circuit substrate (FPC) 40 and the CF substrate 30 are directly connected by using the anisotropic conductive adhesive (ACF) 43 are respectively equal in area. Thus, dummy terminals 44 as shown in FIG. 3B may be arranged.

Here, with an increase in size of a display screen in a recent electric equipment or a decrease in size of an electric equipment, for example, a frame size (size between the outer shape of a display screen region and the outer shape of a TFT substrate, for example, size A shown in FIGS. 3A and 3B) not contributing to the display screen is required to be reduced.

In order to meet the request as stated above, a terminal connection structure of the invention includes plural first connection terminals which are arranged side by side in one direction on a first circuit substrate, and plural second connection terminals which are arranged side by side in the one direction on a second resin circuit substrate overlappingly connected so the first circuit substrate and are respectively connected to the plural first connection terminals. Each of the plural second connection terminals includes plural first wirings extending in a direction crossing the one direction, and a second wiring connected to the plural first wirings and extending in the one direction. The second wiring is provided in a region where the second circuit substrate is overlapped and connected to the first circuit substrate.

An electric equipment including the terminal connection structure realizes the miniaturization of the electric equipment, and the reduction of the frame size not contributing to the display screen of the electric equipment including the display screen. In the following, the terminal connection structure of the invention will be described in detail by using embodiments.

First Embodiment

FIG. 1A is a plan view showing a touch sensor built-in display device including terminal connection structure of a first embodiment of the invention. FIG. 1B is an enlarged view showing a region B indicated by a broken line in FIG. 1A and showing a connection structure between a connection terminal provided on a display device and a flexible printed circuit substrate (FPC). FIG. 1C is a view showing a section taken along line C-C in FIG. 1B.

As shown in FIG. 1A, a touch sensor built-in display device 10 including the terminal connection structure of the first embodiment of the invention includes, for example, a TFT substrate in which pixels including thin film transistors (TFT) are arranged in a matrix form on an insulation substrate, and a color filter (CF) substrate 30 which is a first circuit substrate arranged to face the TFT substrate 20 and includes touch sensor detection electrodes 31.

Incidentally, although not shown in the drawings, for example, a liquid crystal layer or an organic EL element layer is provided between the TFT substrate 20 and the CF substrate 30 and on the TFT substrate 20, and the touch sensor built-in display device 10 displays an image in a display area D based on signals from the thin film transistors (TFTs) arranged on the TFT substrate 20. Besides, a driver IC 21 for controlling driving of the thin film transistors (TFTs) arranged on the TFT substrate 20 is provided on the TFT substrate 20.

Besides, signals detected by the touch sensor detection electrodes 31 are connected to a touch sensor control part 100 for detecting a touch to the display area D through a flexible printed circuit substrate (FPC) 40. A region where the touch sensor detection electrodes 31 are arranged and the display area D are overlapped and arranged in plan view. The touch sensor detection electrodes 31 and the touch sensor control part 100 detect a position of the display area D where a finger touches, display, for example, various buttons in the display region D instead of normal buttons, and enable input of information.

Hereinafter, with reference to FIG. 1B, description will be made on a terminal connection structure between first connection terminals 32 provided on the CF substrate 30 and connected to the touch sensor detection electrodes 31 and second connection terminals 42 arranged on the flexible printed circuit substrate (FPC) 40.

As shown in FIG. 1B, the CF substrate 30 includes the plural first connection terminals 32 connected to the touch sensor detection electrodes 31 and arranged side by side in one direction (X direction in FIG. 1B). Besides, the flexible printed circuit substrate (FPC) 40, which is overlapping connected so the CF substrate 30 and is a second resin circuit substrate, includes the plural second connection terminals 42 arranged side by side in the one direction (X direction in FIG. 1A).

As shown in FIGS. 1A and 1B, the flexible printed circuit substrate (FPC) 40 overlappingly connected to the CF substrate 30 is positioned in a region where a part of an inside of an outer edge of the second circuit substrate 40 overlaps the driver IC 21 for controlling driving of the thin film transistors provided on the TFT substrate 20 in plan view.

Besides, when reference is made to FIG. 1C, the CF substrate 30 and the flexible printed circuit substrate (FPC) 40 are firmly connected by providing, for example, an anisotropic conductive adhesive (ACF) 43 between the plural first wirings 42a constituting the respective plural second connection terminals 42 and extending in a direction (Y direction in FIGS. 1A and 1B) crossing the one direction (X direction in FIGS. 1A and 1B) and by bonding.

Incidentally, as shown in FIG. 1C, the flexible printed circuit substrate (FPC) 40 includes a base film 40a and a cover film 40b, and wirings 40 electrically connected to the second connection terminals 42 are sandwiched and arranged between the base film 40a and the cover film 40b.

Besides, as shown in FIG. 1B, each of the plural second connection terminals 42 includes the plural first wirings 42a extending in the direction (Y direction in FIGS. 1A and 1B) crossing the one direction (X direction in FIGS. 1A and 1B) and a second wiring 42b connected to the plural first wirings and extending the one direction (X direction in FIGS. 1A and 1B). The plural first wirings 42a and the second wiring 42b are provided in a region α where the flexible printed circuit substrate (FPC) 40 is overlapped and connected to the CF substrate 30.

That is, in the terminal connection structure provided in the touch sensor built-in display device 10, the first wirings 42a of the second connection terminal 42 provided on the flexible printed circuit substrate (FPC) 40 are bundled and connected (wire-connected) by the second wiring 42b which is provided in the region where the flexible printed circuit substrate (FPC) 40 is overlapped and connected to the CF substrate 30 and extends in the one direction (X direction in FIGS. 1A and 1B).

Also in the terminal connection structure provided in the touch sensor built-in display device 10, a dummy terminal 44 as shown in FIG. 1B may be arranged in the region α where the flexible printed circuit substrate (FPC) 40 is overlapped and connected to the CF substrate 30 so as to obtain more uniform connection on the whole connection surface of she substrates.

The terminal connection structure of the invention may be applied to an electric equipment such as the touch sensor built-in display device 10. That is, the electric equipment to which the terminal connection structure of the invention is applied may be the touch sensor built-in display device 10 which includes the TFT substrate 20 in which pixels including thin film transistors are arranged in a matrix form on an insulation substrate, the plural first connection terminals 32 which are arranged side by side in the one direction (X direction in FIG. 1A) on the first circuit substrate 30 arranged to face the TFT substrate 20 and including the touch sensor detection electrodes, and the plural second connection terminals 42 which are arranged side by side in the one direction (X direction in FIG. 1A) on the second resin circuit substrate 40 overlappingly connected to the first circuit substrate 30 and are respectively connected to the plural first connection terminals 32. Each of the plural second connection terminals 42 includes the plural first wirings 42a extending in the direction (Y direction in FIGS. 1A and 1B) crossing the one direction (X direction in FIGS. 1A and 1B), and the second wiring 42b connected to the plural first wirings 42a and extending in the one direction (X direction in FIGS. 1A and 1B). The second wiring 42b is provided in the region α where the second circuit substrate 40 is overlapped and connected to the first circuit substrate 30.

Besides, the second wiring 42b may be positioned in the center portion of three portions obtained dividing the region α where the second circuit substrate 40 is overlapped and connected to the first circuit substrate 30 into three equal parts in the direction perpendicular to the one direction (X direction in FIG. 1A). Besides, the second wiring 42b may be positioned in the censer portion of the region α where the second circuit substrate 40 is overlapped and connected to be first circuit substrate 30 in the direction perpendicular to the one direction (X direction in FIG. 1A).

Since the second wiring 42b is provided at the above mentioned position, when the CF substrate 30 and the flexible printed circuit substrate (FPC) 40 are bonded using, for example, the anisotropic conductive adhesive (ACF) 43, unit areas of the adhesion by she ACF 43 on the adhesion surface of both the substrates become substantially equal to each other. Thus, there is an effect that the adhesion of both the substrates becomes strong.

Besides, in the above, although the description is made on the mode in which the terminal connection structure is applied to the so-called in-cell touch panel built-in display device, the terminal connection structure of the invention may be applied to an on cell touch panel built-in display device as shown in FIG. 1D.

FIG. 1D is a plan view showing another touch sensor built-in display device including the terminal connection structure of the first embodiment of the invention. The touch sensor shown in FIG. 1D includes plural first detection electrodes 31a arranged side by side and extending in one direction (X direction in FIG. 1D), plural second touch sensor detection electrodes 31b arranged side by side and extending in a direction (for example, Y direction in FIG. 1D) different from the direction in which the first touch sensor detection electrodes 31a are arranged, and a touch sensor control part 110 which detects a touch to a display surface by controlling the potential of one of the first touch sensor detection electrode 31a and the second touch sensor detection electrode 31b and by detecting an electrical change occurring in the other.

Second Embodiment

With the reduction in thickness of an electric equipment, when the CF substrate 30 in FIG. 1C, which is the sectional view of the touch sensor built-in display device including the terminal connection structure of the first embodiment, is made further thin, the flexible printed circuit substrate (FPC) 40 is installed in a state where it runs on the electric component 21 provided on the TFT substrate 20. A touch sensor built-in display device 10 including a terminal connection structure of a second embodiment in which such a state is avoided will be described below.

Figure 2A:
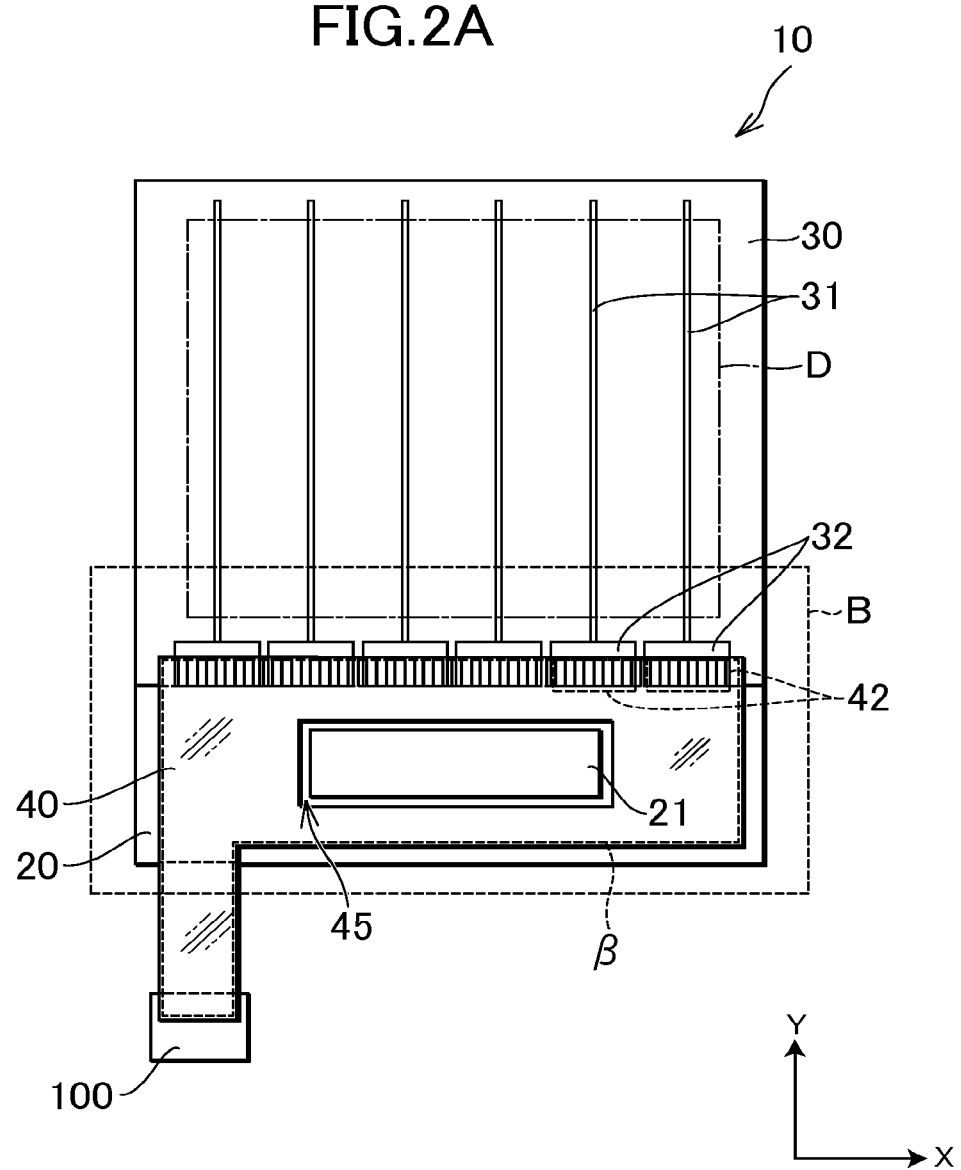
FIG. 2A is a plan view showing a touch sensor built-in display device including a terminal connection structure of a second embodiment of the invention.

FIG. 2A is a plan view showing the touch sensor built-in display device including the terminal connection structure of the second embodiment of the invention. FIG. 2B is an enlarged view showing a region B indicated by a broken line in FIG. 2A and showing a connection structure between a connection terminal provided on a display device and a flexible printed circuit substrate (FPC). FIG. 2C is a view showing a section taken along line C-C in FIG. 2B.

As shown in FIGS. 2A and 2B, similarly to the touch sensor built-in display device including the terminal connection structure of the first embodiment, the touch sensor built-in display device 10 including the terminal connection structure of the second embodiment includes a TFT substrate 20 in which pixels including thin film transistors are arranged in a matrix form on an insulation substrate, plural first connection terminals 32 which are arranged side by side in one direction (X direction in FIGS. 2A and 2B) on a first circuit substrate 30 arranged to face the TFT substrate 20 and including touch sensor detection electrodes 31, and plural second connection terminals 42 which are arranged side by side in the one direction (X direction in FIGS. 2A and 2B) on a second resin circuit substrate 40 overlappingly connected to the first circuit substrate 30 and are respectively connected to the plural first connection terminals 32. Each of the plural second connection terminals 42 includes plural first wirings 42a extending in a direction (Y direction in FIGS. 2A and 2B) crossing the one direction (X direction in FIGS. 2A and 2B), and a second wiring 42b connected to the plural first wirings 42a and extending in the one direction (X direction in FIGS. 2A and 2B). The second wiring 42b is provided in a region α where the second circuit substrate 40 is overlapped and connected to the first circuit substrate 30.

As shown in FIGS. 2A and 2B, an electric component (driver IC 21) for controlling driving of she thin film transistors is provided on the TFT substrate 20 of the touch sensor built-in display device 10. The driver IC 21 is positioned in a region (region β surrounded by a broken line in FIG. 2A) overlapping an inside of an outer edge of the second circuit substrate 40 in plan view. The second circuit substrate 40 of the touch sensor built-in display device 10 of the second embodiment includes an opening part 45 opening so as to avoid overlapping with the electric component in plan view in the region β surrounded by the broken line in FIG. 2A.

As stated above, in the second circuit substrate 40, even when the area in which wirings 46 are arranged is limited, that is, even when a dimension I in FIG. 2B is small, the terminal connection structure of the invention can be appropriately used.

FIG. 2D is an enlarged view showing the region B indicated by the broken line in FIG. 2A and showing another example of the connection structure between the connection terminal provided on the display device and the flexible printed circuit substrate (FPC).

As shown in FIG. 2D, in plan view, the first connection terminal 32 of the touch sensor built-in display device 10 may be arranged in a region other than a region where the opening part provided in the direction (Y direction in FIG. 2D) perpendicular to the one direction (X direction in FIG. 2D) in the region α where the second circuit substrate 40 is overlapped and connected to the first circuit substrate 30.

In this case, in plan view, the region α where the second circuit substrate 40 is overlapped and connected to the first circuit substrate 30 and the region provided with the opening part 45 provided in the second circuit substrate 40 can be provided to be closer to each other, and there is an effect that a frame size (size between the outer shape of a display screen region and the outer shape of the TFT substrate, for example, a size II shown in FIG. 2D) not contributing to the display screen can be reduced.

Besides, similarly to the terminal connection structure of the first embodiment, the terminal connection structure of the second embodiment also may be applied to not only the in-cell touch panel built-in display device but also to the on-cell touch panel built-in display device.

While there have been described what are at present considered to be certain embodiments of the invention, it will be understood that various modifications may be made thereto, and is intended that the appended claims cover all such modifications as fall within the true sprit and scope of the invention.

The invention claimed is:

1. A touch sensor comprising:
   a first substrate;
   a plurality of first connection terminals which are arranged side by side in one direction on the first substrate;
   a second substrate made of resin, overlapped with and connected to the first substrate; and
   a plurality of second connection terminals which are arranged side by side in the one direction on the second substrate and respectively connected to the plurality of first connection terminals, wherein
   each of the plurality of second connection terminals includes a plurality of first wirings extending in a direction crossing the one direction, and a second wiring connected to the plurality of first wirings and extending in the one direction, and
   the second wiring is provided in a region where the second substrate is overlapped with the first substrate.

2. The touch sensor according to claim 1, wherein the second wiring is positioned in a center portion of three portions obtained by dividing the region where the second substrate is overlapped with and connected to the first substrate into three equal parts in a direction perpendicular to the one direction.

3. The touch sensor according to claim 1, wherein the second substrate includes an opening part which is sandwiched between two of the plurality of first wirings.

4. The touch sensor according to claim 3, wherein the first connection terminals are arranged without being adjacent to a region of the second substrate which is next to the opening part in a direction perpendicular to the one direction.

5. A touch sensor comprising:
   a first substrate;
   a plurality of first connection terminals which are arranged side by side in one direction on the first substrate;
   a second substrate made of resin, overlapped with and connected to the first substrate; and
   a plurality of second connection terminals which are arranged side by side in the one direction on the second substrate and respectively connected to the plurality of first connection terminals, wherein
   each of the plurality of second connection terminals includes a plurality of first wirings extending in a direction crossing the one direction, and a second wiring connected to the plurality of first wirings and extending in the one direction,
   the second wiring is provided in a region where the second substrate is overlapped with the first substrate, and
   the plurality of second connection terminals are sorted into some groups, each of which includes some of the plurality of terminals connected to corresponding one of the plurality of first connection terminals.

6. The touch sensor according to claim 5, wherein the second wiring is positioned in a center portion of three portions obtained by dividing the region where the second substrate is overlapped with and connected to the first substrate into three equal parts in a direction perpendicular to the one direction.

7. The touch sensor according to claim 5, wherein the second substrate includes an opening part which is sandwiched between two of the plurality of first wirings.

8. The touch sensor according to claim 7, wherein the first connection terminals are arranged without being adjacent to a region of the second substrate which is next to the opening part in a direction perpendicular to the one direction.

* * * * *